(12) United States Patent
Kang et al.

(10) Patent No.: US 11,699,855 B2
(45) Date of Patent: Jul. 11, 2023

(54) ANTENNA MODULE

(71) Applicant: Samsung Electro-Mechanics Co., Ltd., Suwon-si (KR)

(72) Inventors: Kyung In Kang, Suwon-si (KR); Jeong Ki Ryoo, Suwon-si (KR); Kyu Bum Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/179,476

(22) Filed: Feb. 19, 2021

(65) Prior Publication Data

US 2021/0175629 A1     Jun. 10, 2021

Related U.S. Application Data

(63) Continuation of application No. 16/296,900, filed on Mar. 8, 2019, now Pat. No. 10,957,982.

(30) Foreign Application Priority Data

Apr. 23, 2018 (KR) ........................ 10-2018-0046816
Aug. 3, 2018 (KR) ........................ 10-2018-0090870

(51) Int. Cl.
    *H01Q 9/04*        (2006.01)
    *H01Q 1/22*        (2006.01)
    (Continued)

(52) U.S. Cl.
    CPC ..... *H01Q 9/0457* (2013.01); *H01L 23/49827* (2013.01); *H01L 23/66* (2013.01);
    (Continued)

(58) Field of Classification Search
    CPC ... H01Q 21/061; H01Q 21/065; H01Q 1/2238
    See application file for complete search history.

(56) References Cited

U.S. PATENT DOCUMENTS

| 4,835,538 A | 5/1989 | McKenna et al. |
| 8,400,307 B2 | 3/2013 | Kataya et al. |

(Continued)

FOREIGN PATENT DOCUMENTS

| CN | 102007519 A | 4/2011 |
| CN | 102956964 A | 3/2013 |

(Continued)

OTHER PUBLICATIONS

Korean Office Action dated Aug. 13, 2021, in counterpart Korean Patent Application No. 10-2020-0005735 (5 pages in English and 5 pages in Korean).

(Continued)

*Primary Examiner* — Seokjin Kim
(74) *Attorney, Agent, or Firm* — NSIP Law

(57) ABSTRACT

An antenna module includes a ground layer including a through-hole; a feed via disposed to pass through the through-hole; a patch antenna pattern spaced apart from the ground layer and electrically connected to one end of the feed via; a coupling patch pattern spaced apart from the patch antenna pattern; a first dielectric layer to accommodate the patch antenna pattern and the coupling patch pattern; a second dielectric layer to accommodate at least a portion of the feed via and the ground layer; and electrical connection structures disposed between the first dielectric layer and the second dielectric layer to separate the first dielectric layer from the second dielectric layer.

13 Claims, 16 Drawing Sheets

(51) Int. Cl.
  *H01L 23/498* (2006.01)
  *H01L 23/66* (2006.01)
  *H01L 23/00* (2006.01)
  *H01Q 21/06* (2006.01)

(52) U.S. Cl.
  CPC .............. *H01L 24/13* (2013.01); *H01L 24/73* (2013.01); *H01Q 1/2283* (2013.01); *H01Q 1/2291* (2013.01); *H01Q 21/065* (2013.01); *H01L 2223/6677* (2013.01); *H01L 2224/73253* (2013.01); *H01L 2924/1421* (2013.01)

(56) References Cited

U.S. PATENT DOCUMENTS

| | | | |
|---|---|---|---|
| 9,064,787 | B2 | 6/2015 | Boeck et al. |
| 9,698,487 | B2 | 7/2017 | Sudo et al. |
| 10,468,764 | B2 | 11/2019 | Kugler et al. |
| 10,957,982 | B2 * | 3/2021 | Kang ................... H01Q 9/26 |
| 2003/0103006 | A1 | 6/2003 | Yamada |
| 2009/0256752 | A1 | 10/2009 | Akkermans et al. |
| 2012/0104574 | A1 | 5/2012 | Boeck et al. |
| 2013/0050028 | A1 | 2/2013 | Nogami |
| 2014/0176392 | A1 | 6/2014 | Han et al. |
| 2016/0049723 | A1 * | 2/2016 | Baks ................... H01Q 9/0457 343/848 |
| 2016/0056544 | A1 | 2/2016 | Garcia et al. |
| 2016/0315390 | A1 | 10/2016 | Oh et al. |
| 2016/0336646 | A1 | 11/2016 | Baek et al. |
| 2017/0125895 | A1 | 5/2017 | Baks et al. |
| 2018/0062255 | A1 | 3/2018 | Kugler et al. |
| 2018/0076526 | A1 | 3/2018 | Garcia et al. |
| 2018/0205155 | A1 | 7/2018 | Mizunuma et al. |
| 2018/0212311 | A1 | 7/2018 | Hwang et al. |
| 2019/0089038 | A1 * | 3/2019 | Liao ................... H01L 23/49827 |
| 2019/0139890 | A1 * | 5/2019 | Lu ......................... H01L 23/528 |
| 2019/0363432 | A1 * | 11/2019 | Hayashi ................. B32B 3/266 |
| 2019/0393172 | A1 * | 12/2019 | Pietambaram .......... H01L 24/19 |

FOREIGN PATENT DOCUMENTS

| | | |
|---|---|---|
| CN | 107851903 A | 3/2018 |
| JP | 2004-247965 A | 9/2004 |
| JP | 2017-28245 A | 2/2017 |
| KR | 10-1164618 B1 | 7/2012 |
| KR | 10-1412946 B1 | 6/2014 |
| KR | 10-2016-0132649 A | 11/2016 |
| WO | WO 02/03499 A1 | 1/2002 |
| WO | WO 2017/047396 A1 | 3/2017 |

OTHER PUBLICATIONS

Korean Office Action dated May 29, 2019 in counterpart Korean Patent Application No. 10-2018-0090870 (6 pages in English, 6 pages in Korean).

Chinese Office Action dated Dec. 1, 2022, in counterpart Chinese Patent Application No. 201910313065.4 (18 pages in English, 14 pages in Chinese).

Chinese Office Action dated May 11, 2023, in counterpart Chinese Patent Application No. 20191031306.4 (4 pages in Chinese).

* cited by examiner

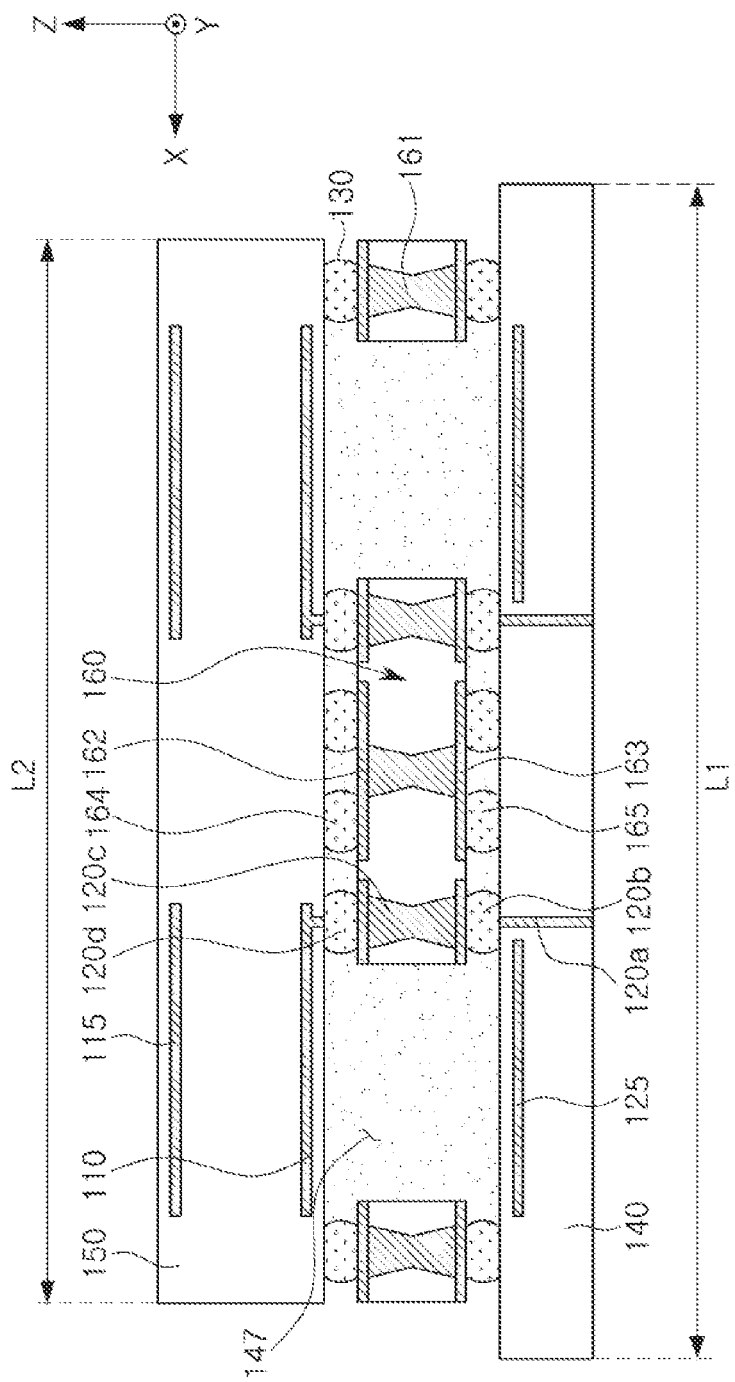

ANTENNA MODULE

CROSS-REFERENCE TO RELATED APPLICATIONS

This application is a Continuation Application of U.S. patent application Ser. No. 16/296,900, filed on Mar. 8, 2019, which claims the benefit under 35 USC 119(a) of Korean Patent Application No. 10-2018-0046816 filed on Apr. 23, 2018 and Korean Patent Application No. 10-2018-0090870 filed on Aug. 3, 2018 in the Korean Intellectual Property Office, the entire disclosures of which is incorporated herein by reference for all purposes.

BACKGROUND

1. Field

The following description relates to an antenna module.

2. Description of Background

Mobile communications data traffic is rapidly increasing every year. Technological developments are being actively conducted in order to support the transmission of such rapidly increased amounts of data in real time in wireless networks. For example, data generated by applications such as IoT (Internet of Thing), augmented reality (AR), virtual reality (VR), live VR/AR combined with SNS, autonomous driving, sync view (a real time image of a user's point of view is transmitted using an ultra small camera), and the like require communications (e.g., 5G communications, mmWave communications, etc.) for supporting the transmission and a reception of large amounts of data.

Therefore, recently, millimeter wave (mmWave) communications including 5th Generation (5G) communications have been researched, and research into the commercialization/standardization of an antenna module able to smoothly implement millimeter wave communications have also been performed.

Since radio frequency (RF) signals within high frequency bands (e.g., 24 GHz, 28 GHz, 36 GHz, 39 GHz, 60 GHz, and the like) are easily absorbed in a transmission process and lead to loss, quality of communications may be sharply deteriorated. Therefore, an antenna for communications in the high frequency bands requires a technical approach different from that of conventional antenna technology, and may require special technology developments such as a separate power amplifier for securing an antenna gain, integrating an antenna and an RFIC, securing effective isotropic radiated power (EIRP), and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna module includes a ground layer including a through-hole; a feed via disposed to pass through the through-hole; a patch antenna pattern spaced apart from the ground layer and electrically connected to one end of the feed via; a coupling patch pattern spaced apart from the patch antenna pattern; a first dielectric layer to accommodate the patch antenna pattern and the coupling patch pattern; a second dielectric layer to accommodate at least a portion of the feed via and the ground layer; and electrical connection structures disposed between the first dielectric layer and the second dielectric layer to separate the first dielectric layer from the second dielectric layer.

A dielectric constant of at least a portion of a space between the patch antenna pattern and the ground layer may be smaller than a dielectric constant of the first dielectric layer and a dielectric constant of the second dielectric layer.

A dielectric constant of the first dielectric layer may be greater than a dielectric constant of the second dielectric layer.

The first dielectric layer may include a cavity facing the second dielectric layer.

The second dielectric layer may include a cavity facing the first dielectric layer.

The electrical connection structures may surround the coupling patch pattern when viewed in a vertical direction.

The antenna module may include an end-fire antenna at least partially disposed in the second dielectric layer and spaced apart from the ground layer, and a length of a surface of the second dielectric layer may be greater than a length of a surface of the first dielectric layer.

A width of a portion of the feed via corresponding a level between the first dielectric layer and the second dielectric layer may be greater than a width of other portions of the feed via.

The antenna module may include an encapsulant disposed between the first dielectric layer and the second dielectric layer.

The antenna module may include a sub-substrate disposed between the first dielectric layer and the second dielectric layer and connected to the electrical connection structures, and the sub-substrate may include core vias connected to the electrical connection structures.

The antenna module may include a patch antenna feed line spaced apart from the ground layer and electrically connected to the feed via; an integrated circuit (IC) spaced apart from the patch antenna feed line; and a wiring via to electrically connect the patch antenna feed line to the IC.

In another general aspect, an antenna module includes a ground layer including a through-hole; a feed via disposed to pass through the through-hole; a patch antenna pattern spaced apart from the ground layer and electrically connected to one end of the feed via; a coupling patch pattern spaced apart from the patch antenna pattern; a first dielectric layer to accommodate the coupling patch pattern; a second dielectric layer to accommodate the patch antenna pattern and the ground layer; and electrical connection structures disposed between the first dielectric layer and the second dielectric layer to separate the first dielectric layer from the second dielectric layer.

One or both of the first dielectric layer and the second dielectric layer may include a cavity overlapping the patch antenna pattern when viewed in a vertical direction.

The electrical connection structures may be arranged to surround each of the cavities when viewed in the vertical direction.

A dielectric constant of the second dielectric layer may be greater than a dielectric constant of at least a portion of a space between the patch antenna pattern and the coupling patch pattern, and may be smaller than a dielectric constant of the first dielectric layer.

The antenna module may include an end-fire antenna at least partially disposed in the second dielectric layer and spaced apart from the ground layer; a feed line spaced apart from the ground layer and electrically connected to the feed via or the end-fire antenna; an integrated circuit (IC) spaced apart from the feed line; and a wiring via to electrically connect the feed line to the IC.

An electronic device may include the antenna module and a communications module electrically connected to the antenna module.

In another general aspect, an antenna module includes a feed via; a patch antenna pattern disposed on or in a first dielectric layer and electrically connected to the feed via; a coupling patch pattern disposed on or in a second dielectric layer spaced apart from the first dielectric layer; and electrical connection structures to couple the first dielectric layer to the second dielectric layer.

The electrical connection structures may have a melting point that is lower than a melting point of the patch antenna pattern and lower than a melting point of the coupling patch pattern.

Other features and aspects will be apparent from the following detailed description, the drawings, and the claims.

BRIEF DESCRIPTION OF DRAWINGS

FIGS. 2A, 2B, 2C, and 2D are side views illustrating a structure in which a patch antenna pattern is disposed on a first dielectric layer in an antenna module according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
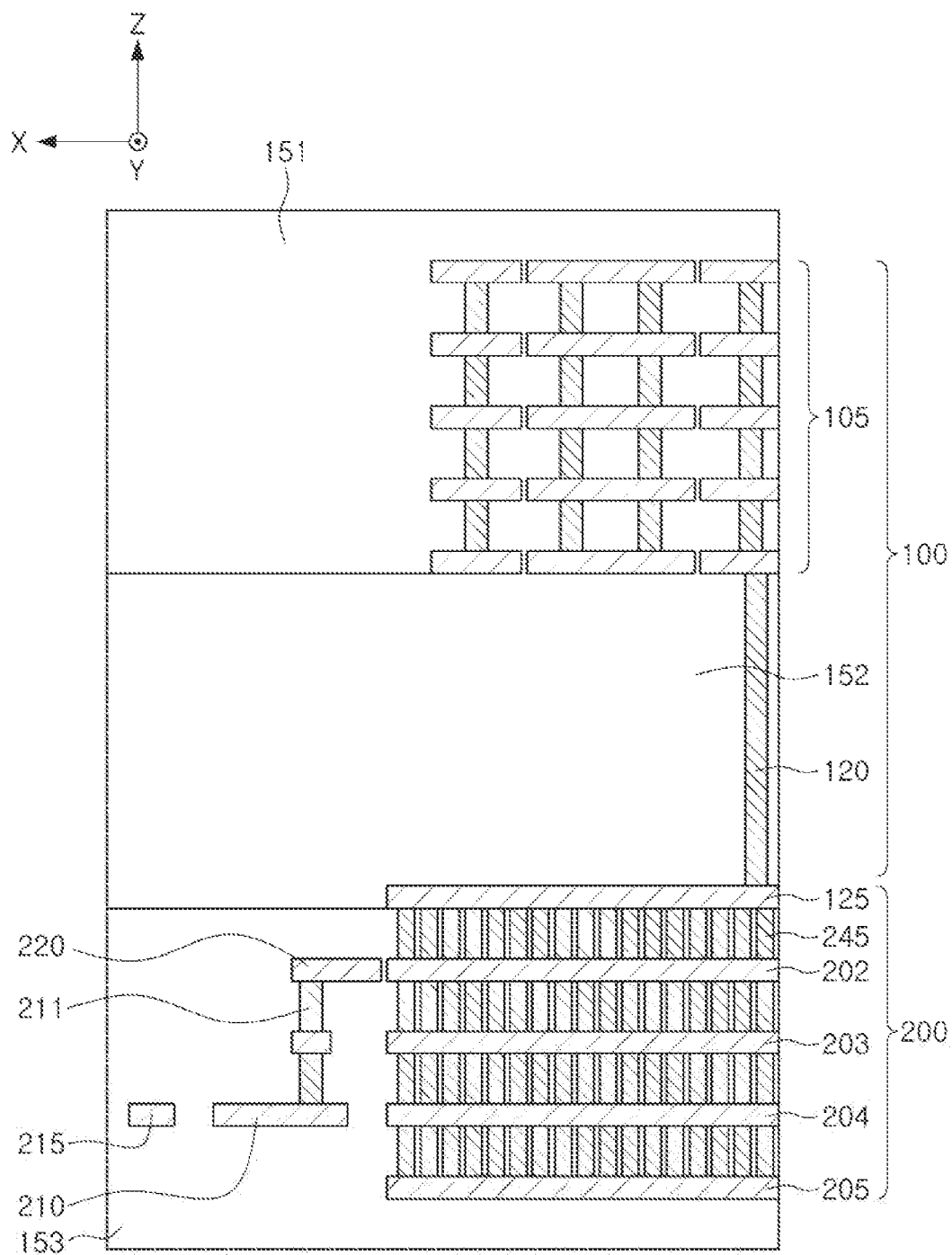
FIG. 1 is a side view schematically illustrating an antenna module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

FIG. 1 is a side view schematically illustrating an antenna module according to an example.

Referring to FIG. 1, an antenna apparatus 100 may be disposed on a connection member 200, and an antenna module may include a plurality of antenna apparatuses corresponding to the antenna apparatus 100. Depending on a design, the connection member 200 may be included in the antenna module. An integrated circuit (IC) may be disposed below the connection member 200.

The connection member 200 may be disposed on a third region 153, electrically connect the antenna module to the IC, and provide electromagnetic isolation and/or impedance between the antenna module and the IC.

The connection member 200 may provide an electrical ground to the antenna module and the IC, and may include at least portions of a ground layer 125, a second ground layer 202, a third ground layer 203, a fourth ground layer 204, a fifth ground layer 205, and a shielding via 245.

Depending on a design, the connection member 200 may include at least one end-fire antenna. The end-fire antenna may include at least portions of an end-fire patch antenna pattern 210, an end-fire antenna feed via 211, a director pattern 215, and an end-fire antenna feed line 220, and may transmit and receive a radio frequency (RF) signal in an X direction.

The antenna module may include an antenna package 105 and a feed via 120, and may transmit and receive the RF signal in a Z direction.

The antenna package 105 may be disposed on a first region 151, and may include a coupling patch pattern and/or a patch antenna pattern to be described below.

The feed via 120 may be disposed on a second region 152 and electrically connect between the antenna package 105 and the connection member 200.

The antenna module may be designed to have the antenna package 105 having a structure advantageous for improving antenna performance, and the connection member 200 having a structure advantageous for providing an electrical connection, electromagnetic isolation, and impedance.

For example, the antenna module may have a structure in which the antenna package 105 and the connection member 200, which are separately manufactured, are bonded to each other. Accordingly, each of the antenna package 105 and the connection member 200 may easily have a structure advantageous for its role (a RF signal transmission and reception, an electrical connection, and the like). Therefore, the antenna module may provide a structure advantageous for miniaturization while having the improved antenna performance.

As compared to a case in which the antenna package 105 and the connection member 200 are manufactured together with each other, since the bonded structure of the antenna package 105 and the connection member 200 may be more efficiently manufactured, an overall manufacturing cost of the antenna module may be reduced and a manufacturing yield thereof may be increased.

According to the bonded structure of the antenna package 105 and the connection member 200, since the antenna module may have a low dielectric region between the antenna package 105 and the connection member 200, diversity of a dielectric constant may be improved.

FIGS. 2A, 2B, 2C, and 2D are side views illustrating a structure in which a patch antenna pattern is disposed on a first dielectric layer in the antenna module.

Referring to FIGS. 2A through 2D, the antenna module according may include patch antenna patterns 110, coupling patch patterns 115, feed vias 120, ground layers 125, electrical connection structures 130, a second dielectric layer 140, a low dielectric region 145, and a first dielectric layer 150.

The ground layer 125 may improve electromagnetic isolation between the patch antenna pattern 110 and the connection member described above, and serve as a reflector for the patch antenna pattern 110 to reflect the RF signal of the patch antenna pattern 110 in the Z direction to further concentrate the RF signal in the Z direction. The ground layer 125 may be disposed to secure a spaced distance from the patch antenna pattern 110 to have reflector characteristics.

Since the antenna module has a bonded structure between the second dielectric layer 140 and the first dielectric layer 150, the spaced distance may be easily secured, and the manufacturing cost for securing the spaced distance may be reduced and the manufacturing yield may be improved.

The ground layer 125 may have a through-hole through which the feed via 120 passes. The through-hole may overlap the patch antenna pattern 110 when viewed in the Z direction.

The feed via 120 may transmit the RF signal received from the patch antenna pattern 110 to the connection member and/or the IC described above, and transmit the RF signal received from the connection member and/or the IC to the connection member and/or the IC described above. Depending on a design, a plurality of feed vias 120 may be connected to a single patch antenna pattern 110 or a plurality patch antenna patterns 110. In a case in which the plurality of feed vias 120 are connected to the single patch antenna pattern 110, each of the plurality of feed vias 120 may be configured so that a horizontal (H) pole RF signal and a vertical (V) pole RF signal, which are polarized waves with respect to each other, flow therethrough.

The patch antenna pattern 110 may be disposed above the ground layer 125 and may be electrically connected to one end of the feed via 120. The patch antenna pattern 110 may receive the RF signal from the feed via 120 to remotely transmit the RF signal in the Z direction, or may remotely receive the RF signal in the Z direction to transmit the RF signal to the feed via 120.

The coupling patch pattern 115 may be disposed above the patch antenna pattern 110. The coupling patch pattern 115 may be electromagnetically coupled to the patch antenna pattern 110, and may further concentrate the RF signal in the Z direction to improve a gain of the patch antenna pattern 110.

The first dielectric layer 150 may provide a space in which the patch antenna pattern 110 and the coupling patch pattern 115 are disposed. For example, the patch antenna pattern 110 and the coupling patch pattern 115 may be inserted into the first dielectric layer 150, or may be disposed on an upper surface and/or a lower surface of the first dielectric layer 150.

The second dielectric layer 140 may be disposed so that at least a portion of the feed via 120 is positioned therein, and may provide a space in which the ground layer 125 is disposed. For example, the ground layer 125 may be inserted into the second dielectric layer 140, or may be disposed on an upper surface of the second dielectric layer 140.

The electrical connection structures 130 may be disposed between the first dielectric layer 150 and the second dielectric layer 140 so as to separate the first dielectric layer 150 and the second dielectric layer 140 from each other. That is, the electrical connection structures 130 may support the first dielectric layer 150 and the second dielectric layer 140.

Accordingly, since the antenna module may easily increase the distance between the ground layer 125 included in the second dielectric layer 140 and the patch antenna pattern 110 included in the first dielectric layer 150, antenna performance of the patch antenna pattern 110 may be easily improved.

Since the electrical connection structures 130 may have a predetermined height, the electrical connection structures 130 may provide a low dielectric region 145 while coupling the second dielectric layer 140 and the first dielectric layer 150 to each other. That is, a dielectric constant Dk of at least a portion of the space between the patch antenna pattern 110 and the ground layer 125 may be smaller than that of the first and second dielectric layers 150 and 140. For example, the low dielectric region 145 may have the same dielectric constant as that of air.

Accordingly, the antenna module may have the low dielectric region 145 according to the coupling between the second dielectric layer 140 and the first dielectric layer 150 even though each of the second dielectric layer 140 and the first dielectric layer 150 does not have a separate low dielectric region. Accordingly, since each of the patch antenna pattern 110 and the ground layer 125 may easily have various boundary conditions of the dielectric constant, the antenna performance may be easily improved.

Therefore, since each of the second dielectric layer 140 and the first dielectric layer 150 may reduce the number of layers and/or height, an overall cost of manufacturing the antenna module may be reduced or an overall yield thereof may be increased.

Since the electrical connection structures 130 may have a melting point lower than that of the patch antenna pattern 110, the coupling patch pattern 115, and the ground layer 125, the electrical connection structures 130 may provide an electrical bonded environment in a state in which the first dielectric layer 150 and the second dielectric layer 140 are separately manufactured.

The dielectric constant of the first dielectric layer 150 may be greater than that the dielectric constant of the second dielectric layer 140. A size of the patch antenna pattern 110 and the coupling patch pattern 115 for maintaining a resonance frequency may become smaller as the dielectric constant of the first dielectric layer 150 becomes larger. In addition, a spaced distance between the patch antenna pattern 110 and an adjacent antenna apparatus may become smaller as the dielectric constant of the first dielectric layer 150 becomes larger. The antenna module may improve the antenna performance by providing the low dielectric region 145 while implementing the miniaturization by using the first dielectric layer 150 having the large dielectric constant.

For example, the first dielectric layer 150 may have a dielectric dissipation factor (DF) smaller than a dielectric dissipation factor of the second dielectric layer 140. Accordingly, energy loss due to the RF signal transmission and reception of the patch antenna pattern 110 may be reduced.

Figure 2A:
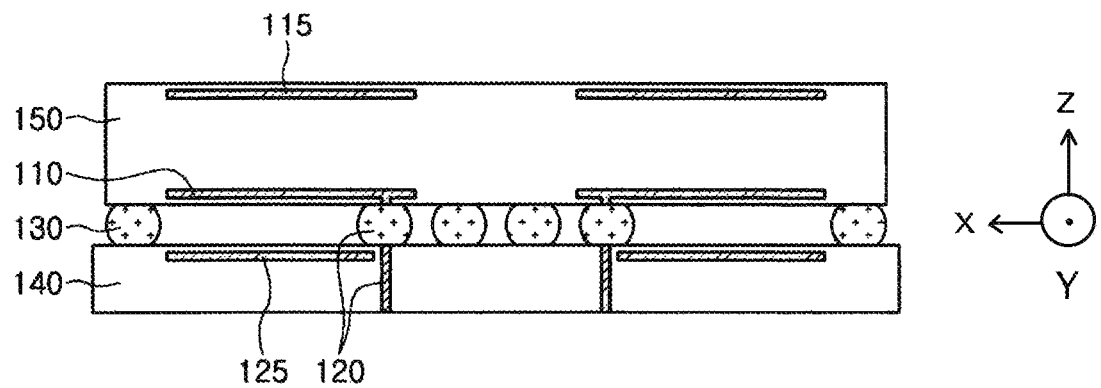
Figure 2B:
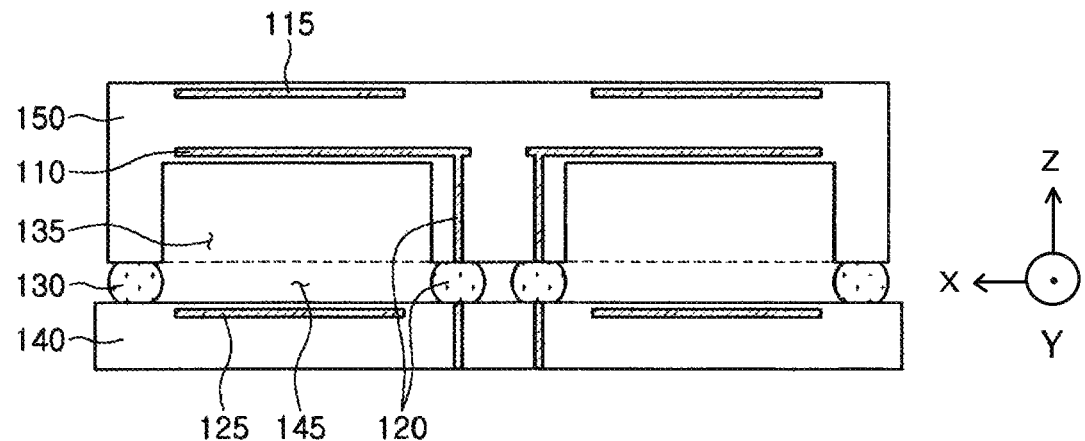

Referring to FIG. 2B, the first dielectric layer 150 may provide a cavity 135 downwardly, or otherwise on a side of the first dielectric layer 150 that faces the second dielectric layer 140.

Figure 2C:
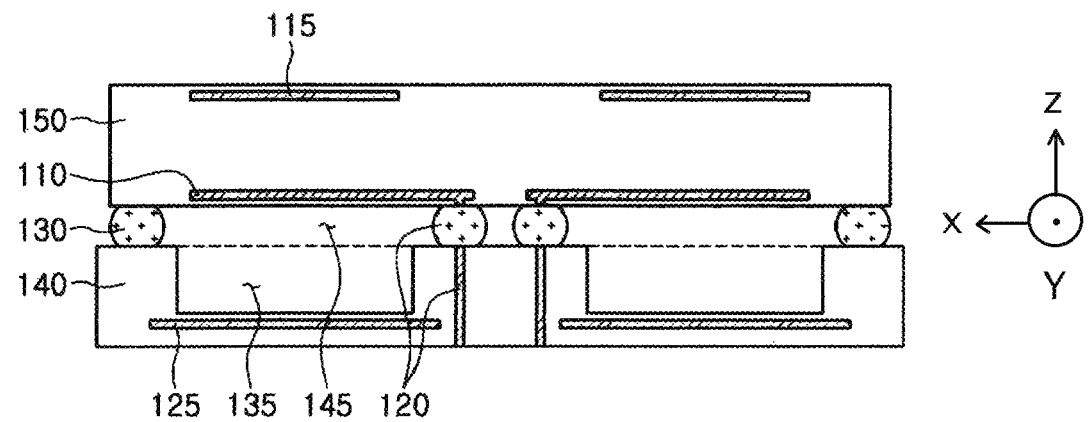

Referring to FIG. 2C, the second dielectric layer 140 may provide a cavity 135 upwardly, or otherwise on a side of the second dielectric layer 140 that faces the first dielectric layer 150.

The cavity 135 may reduce an effective dielectric constant without increasing a physical distance between the patch antenna pattern 110 and the ground layer 125 or without increasing an overall height of the antenna module. Therefore, the size of the antenna module may be further reduced compared to the antenna performance.

The antenna module may increase the distance between the ground layer 125 and the patch antenna pattern 110 or reduce a height of each of the first and second dielectric layers 150 and 140 by increasing the size and/or height of the electrical connection structures 130, even in a case in which the cavity 135 is not present. For example, the electrical connection structures 130 may be designed to be larger than the electrical connection structures between the IC and the connection member. For example, the electrical connection structures 130 may be selected from structures such as solder balls, pins, pads, lands, or bumps, and may have a different structure from the electrical connection structures between the IC and the connection member to thereby increase the size and/or height.

Referring to FIG. 2D, the antenna module may further include a sub-substrate 160 disposed between the first dielectric layer 150 and the second dielectric layer 140 and connected to the electrical connection structures 130. The sub-substrate 160 may provide an environment capable of more easily extending an interval between the first dielectric layer 150 and the second dielectric layer 140, and may further improve electrical connection stability of the electrical connection structures 130.

The sub-substrate 160 may include core vias 161 connected to the electrical connection structures 130, and may include at least portions of an upper core layer 162 connected to upper ends of the core vias 161, a lower core layer 163 connected to lower ends of the core vias 161, upper electrical connection structures 164 connected to the upper core layer 162, and lower electrical connection structures 165 connected to the lower core layer 163.

The sub-substrate 160 may provide a space in which at least portions of second, third, and fourth portions 120b, 120c, and 120d of the feed via are disposed, but may also be spaced apart from the feed via depending on a design.

Referring to FIG. 2D, the antenna module may further include an encapsulant 147 encapsulating a space between the first dielectric layer 150 and the second dielectric layer 140. That is, the encapsulant 147 may be disposed to fill at least a portion of the low dielectric region 145 described above. Accordingly, insulation reliability, heat radiation performance, and impact protection performance between the first dielectric layer 150 and the second dielectric layer 140 may be improved.

Depending on a design, the encapsulant 147 may have a dielectric constant greater than that the dielectric constants of the first and second dielectric layers 150 and 140. Accordingly, since the effective dielectric constant between the ground layer 125 and the patch antenna pattern 110 may be increased, a wavelength of the RF signal transmitting between the ground layer 125 and the patch antenna pattern 110 may be shortened. That is, since an electrical length between the ground layer 125 and the patch antenna pattern 110 may be increased, the antenna module may improve antenna performance according to the distance between the ground layer 125 and the patch antenna pattern 110 even though an overall height thereof is not increased.

Referring to FIG. 2D, a size L1 of an upper surface of the second dielectric layer 150 may be greater than a size L2 of a lower surface of the first dielectric layer 150. That is, the bonded structure of the first dielectric layer 150 and the second dielectric layer 140 may provide an environment in which the first dielectric layer 150 and the second dielectric layer 140 are easily coupled to each other even though they have different sizes.

For example, the second dielectric layer 140 may be greater (longer in the X direction) than the first dielectric layer 150 to provide the space in which the end-fire antenna, described above with reference to FIG. 1, is disposed, or to provide more stable electrical connection and ground, and may also be greater (longer in the X direction) than the first dielectric layer 150 for structural stability of the entirety of the antenna module.

Referring to FIG. 2D, the feed via may have the first portion 120a, the second portion 120b, the third portion 120c, and the fourth portion 120d. The second portion 120b and the fourth portion 120d may have a form similar to that of the electrical connection structures 130, and may be formed simultaneously with the electrical connection structures 130. That is, a width of a portion of the feed via corresponding to a level between the first dielectric layer 150 and the second dielectric layer 140 may be greater than that of other portions of the feed via.

FIGS. 3A, 3B, 3C, and 3D are side views illustrating a structure in which a patch antenna pattern is disposed on a second dielectric layer in the antenna module.

Referring to FIGS. 3A through 3D, the patch antenna pattern 110 may be disposed in the second dielectric layer 140, and the coupling patch pattern 115 may be disposed in the first dielectric layer 150.

A wavelength of the RF signal transmitting between the patch antenna pattern 110 and the coupling patch pattern 115 may become longer as an effective dielectric constant between the patch antenna pattern 110 and the coupling patch pattern 115 becomes smaller. A concentration of the RF signal in the Z direction according to an electromagnetic coupling between the patch antenna pattern 110 and the coupling patch pattern 115 may be greater as the wavelength of the RF signal becomes longer. Therefore, the gain of the patch antenna pattern 110 may be improved as the effective dielectric constant between the patch antenna pattern 110 and the coupling patch pattern 115 becomes smaller.

The electrical connection structures 130 may couple the second dielectric layer 140 and the first dielectric layer 150 to each other while electrically connecting the second dielectric layer 140 and the first dielectric layer 150 to each other. For example, the electrical connection structures 130 may have a melting point lower than that of the patch antenna pattern 110, the coupling patch pattern 115, and the feed via 120. For example, the second dielectric layer 140 and the first dielectric layer 150 may be bonded to each other in a state in which the electrical connection structures 130 are disposed on the upper surface of the second dielectric layer 140 or the lower surface of the first dielectric layer 150, and may be then thermal-treated at a temperature higher than the melting point of the electrical connection structures 130.

The low dielectric region 145 may correspond to the height of the electrical connection structures 130 according to the coupling of the second dielectric layer 140 and the first dielectric layer 150 through the electrical connection structures 130.

Since the low dielectric region 145 is positioned between the second dielectric layer 140 and the first dielectric layer 150, insulation reliability may be secured without a separate insulating material. Therefore, the low dielectric region 145 may be formed of air. The air may have the dielectric constant of substantially one and may not require a separate process to be filled in the low dielectric region 145. Therefore, the effective dielectric constant between the patch antenna pattern 110 disposed in the second dielectric layer 140 and the coupling patch pattern 115 disposed in the first dielectric layer 150 may be easily lowered.

Depending on a design, the low dielectric region 145 may be filled with a dielectric material (e.g., the encapsulant 147) having a dielectric constant lower than that the dielectric constants of the first and second dielectric layers 150 and 140, thereby further improving the insulation reliability.

Figure 3A:
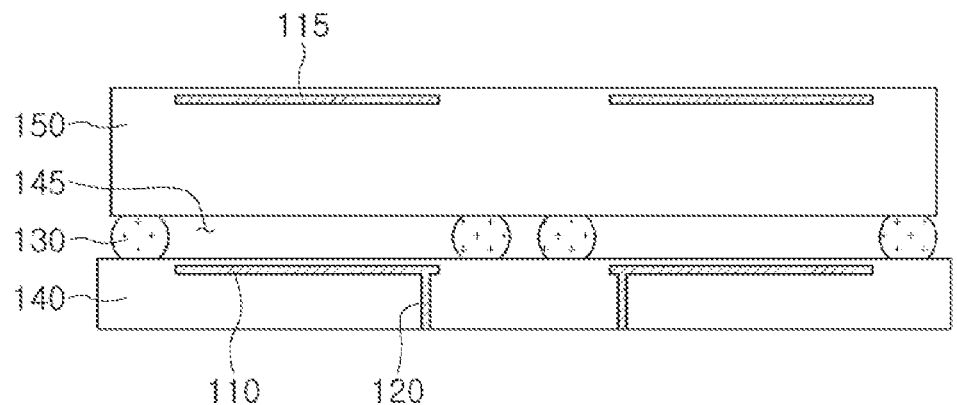
FIGS. 3A, 3B, 3C, and 3D are side views illustrating a structure in which a patch antenna pattern is disposed on a second dielectric layer in an antenna module according to an example.
Figure 3B:
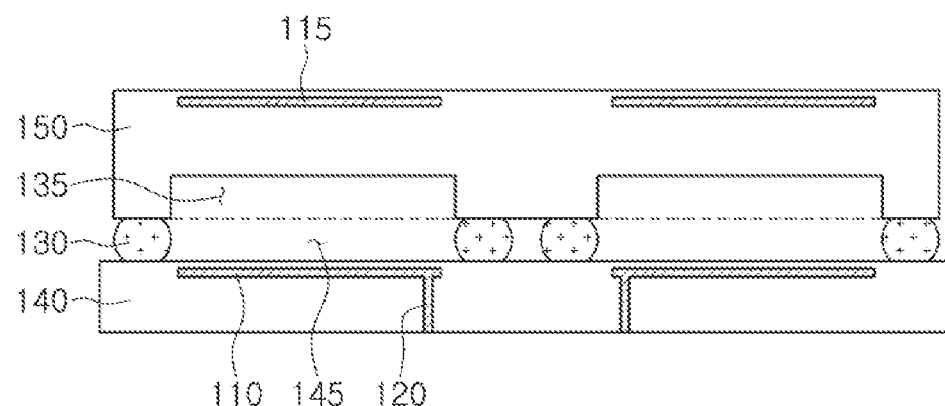

Referring to FIG. 3B, the first dielectric layer 150 may have a cavity 135.

Figure 3C:
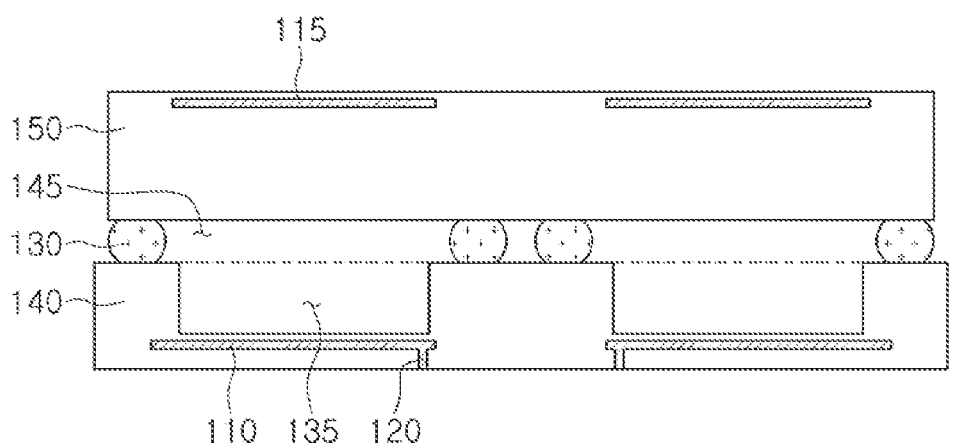

Referring to FIG. 3C, the second dielectric layer 140 may have a cavity 135.

Accordingly, the effective dielectric constant between the patch antenna pattern 110 and the coupling patch pattern 115 may be further lowered as a height of the cavity 135 becomes higher, and may be lowered even without increasing the physical distance between the patch antenna pattern 110 and the coupling patch pattern 115.

The antenna module may further reduce the effective dielectric constant by increasing the size and/or height of the electrical connection structures 130 even in a case in which the cavity 135 is not present. For example, the electrical connection structures 130 may be designed to be larger than the electrical connection structures between the IC and the connection member. For example, the electrical connection structures 130 may be selected from structures such as solder balls, pins, pads, or lands, and may have a different structure from the electrical connection structures between the IC and the connection member to thereby increase the size and/or height.

Figure 3D:
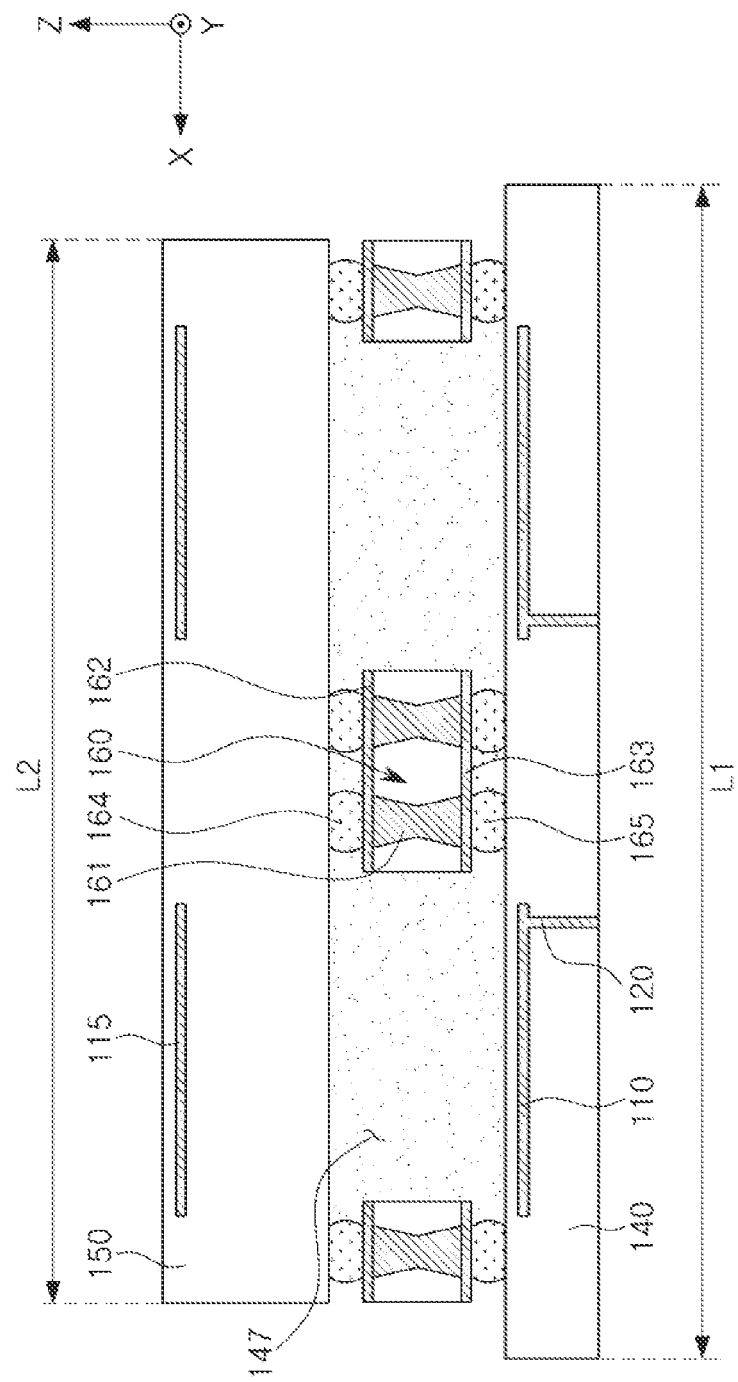

Referring to FIG. 3D, the antenna module may include the sub-substrate 160 to more easily secure a spaced distance between the patch antenna pattern 110 and the coupling patch pattern 115.

FIGS. 4A, 4B, 4C, 4D, and 4E are plan views illustrating an inner portion of the antenna module.

Figure 4A:
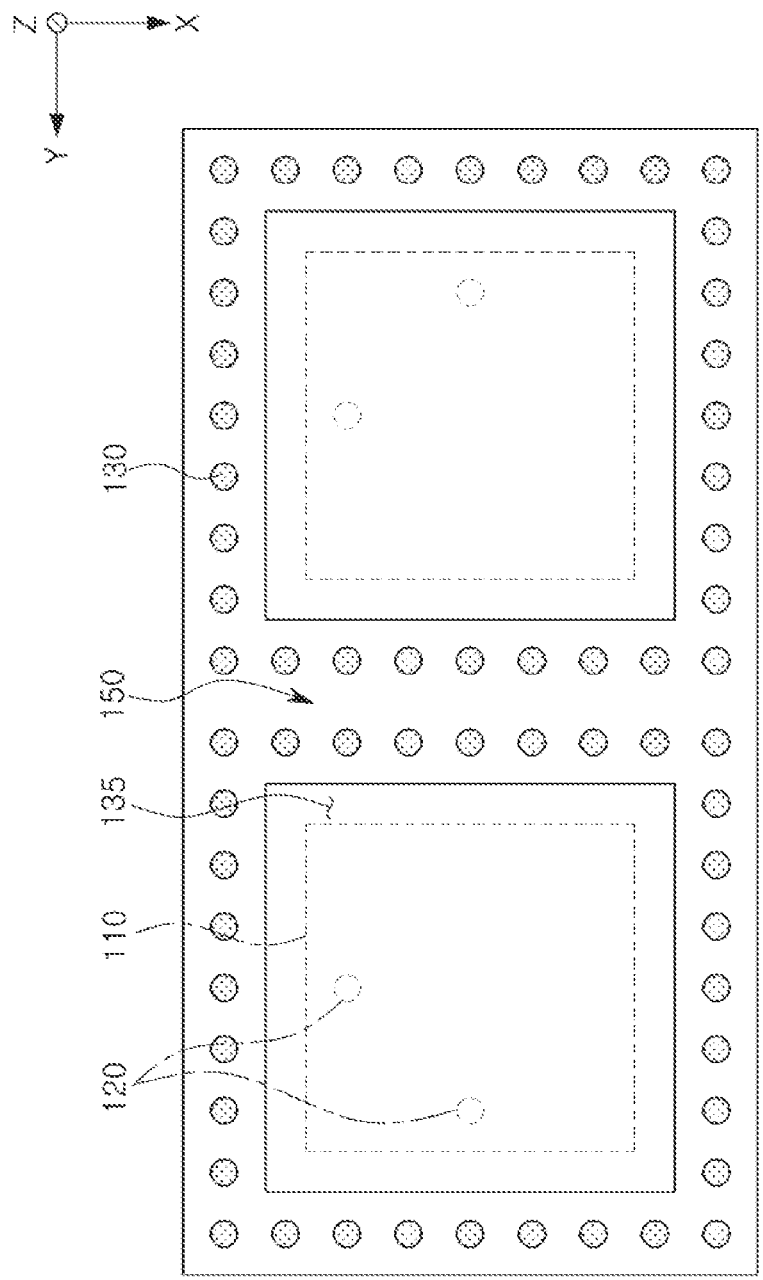
FIGS. 4A, 4B, 4C, 4D, and 4E are plan views illustrating an inner portion of an antenna module according to an example.

Referring to FIG. 4A, the plurality of electrical connection structures 130 included in the antenna module may be arranged to surround a plurality of antenna patterns 110 and/or a plurality of coupling patch patterns, respectively, when viewed in the Z direction.

Accordingly, the electrical connection structures 130 may improve electromagnetic isolation between the plurality of antenna patterns 110, may improve an electromagnetic shielding performance of the antenna module, and may provide an electromagnetic boundary condition for the plurality of antenna patterns 110 to further induce the RF signal transmitting the plurality of antenna patterns 110 in the Z direction.

Figure 4B:
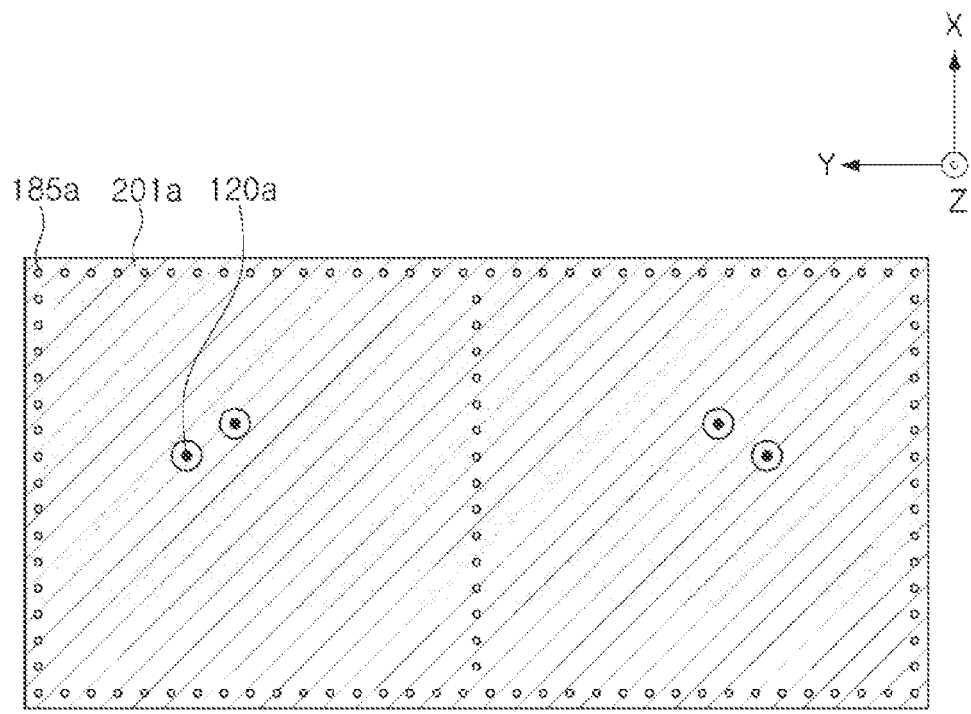

Referring to FIG. 4B, a ground layer 201a may have a through-hole through which the feed via 120a passes, and may be connected to the other end of a grounding via 185a. The ground layer 201a may electromagnetically shield between the patch antenna pattern and the feed line.

Figure 4C:
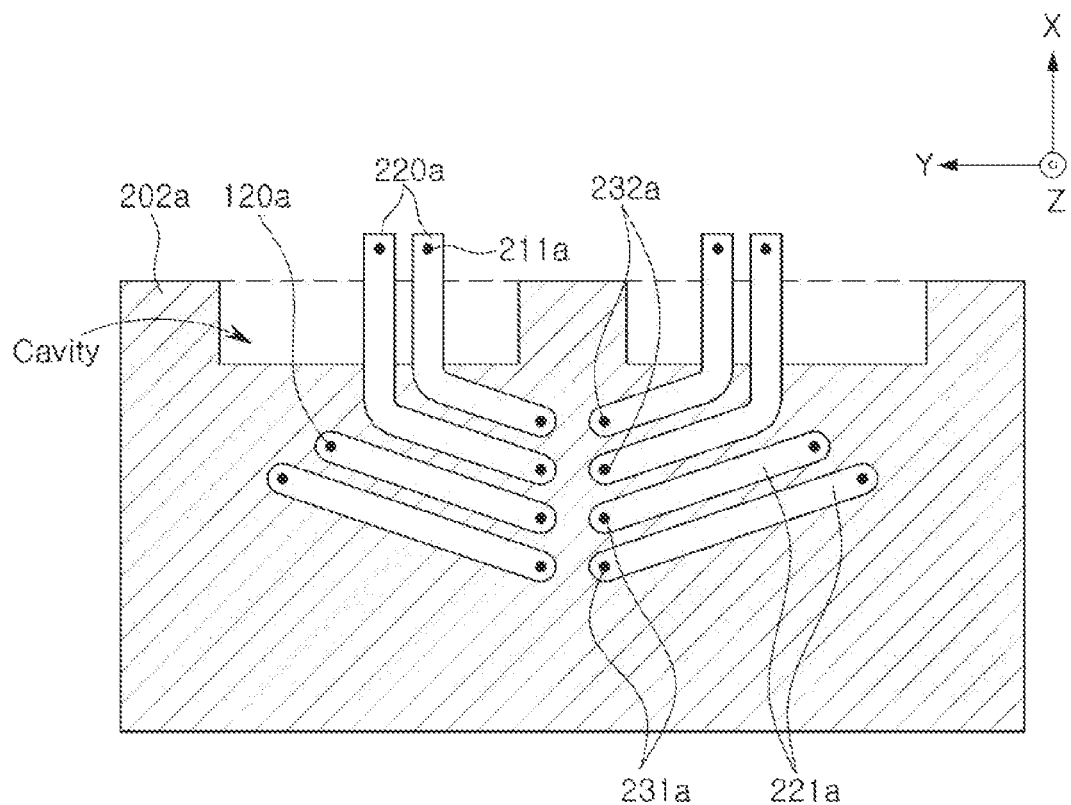

Referring to FIG. 4C, a second ground layer 202a may surround at least a portion of an end-fire antenna feed line 220a and a patch antenna feed line 221a, respectively. The end-fire antenna feed line 220a may be electrically connected to a second wiring via 232a, and the patch antenna feed line 221a may be electrically connected to a first wiring via 231a. The second ground layer 202a may electromagnetically shield between the end-fire antenna feed line 220a and the patch antenna feed line 221a. One end of the end-fire antenna feed line 220a may be connected to an end-fire antenna feed via 211a.

Figure 4D:
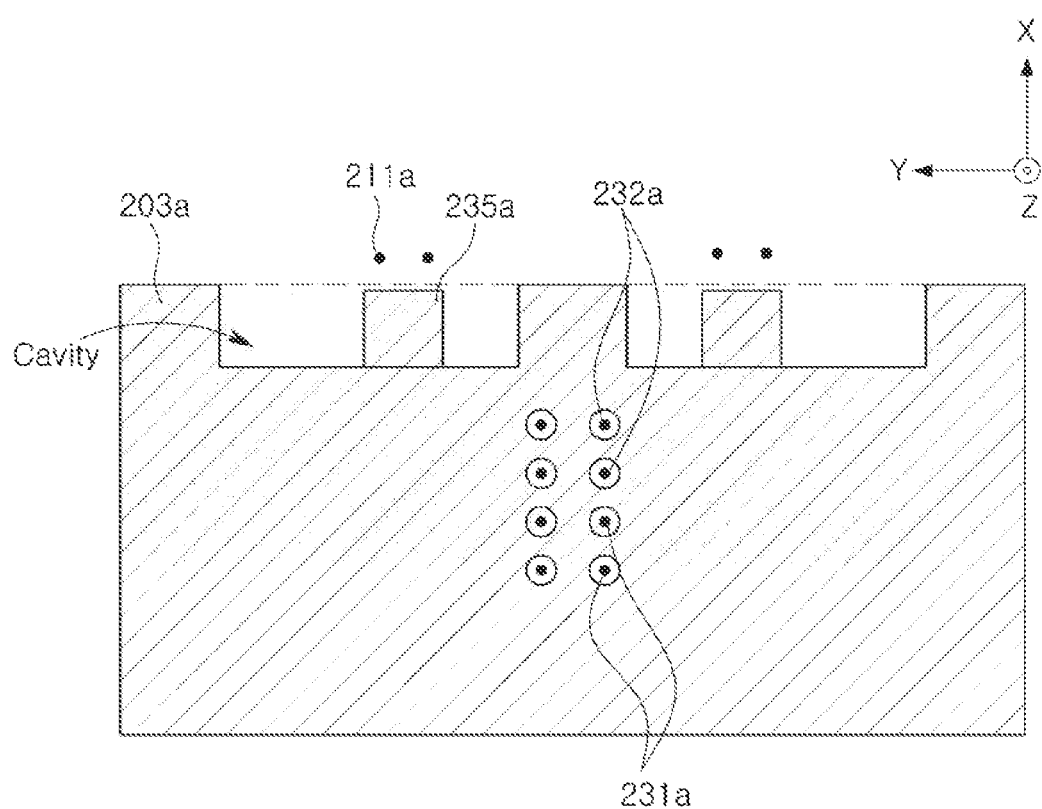

Referring to FIG. 4D, a third ground layer 203a may have a plurality of through-holes through which the first wiring via 231a and the second wiring via 232a pass, and may have a coupling ground pattern 235a. The third ground layer 203a may electromagnetically shield between the feed line and the IC.

Figure 4E:
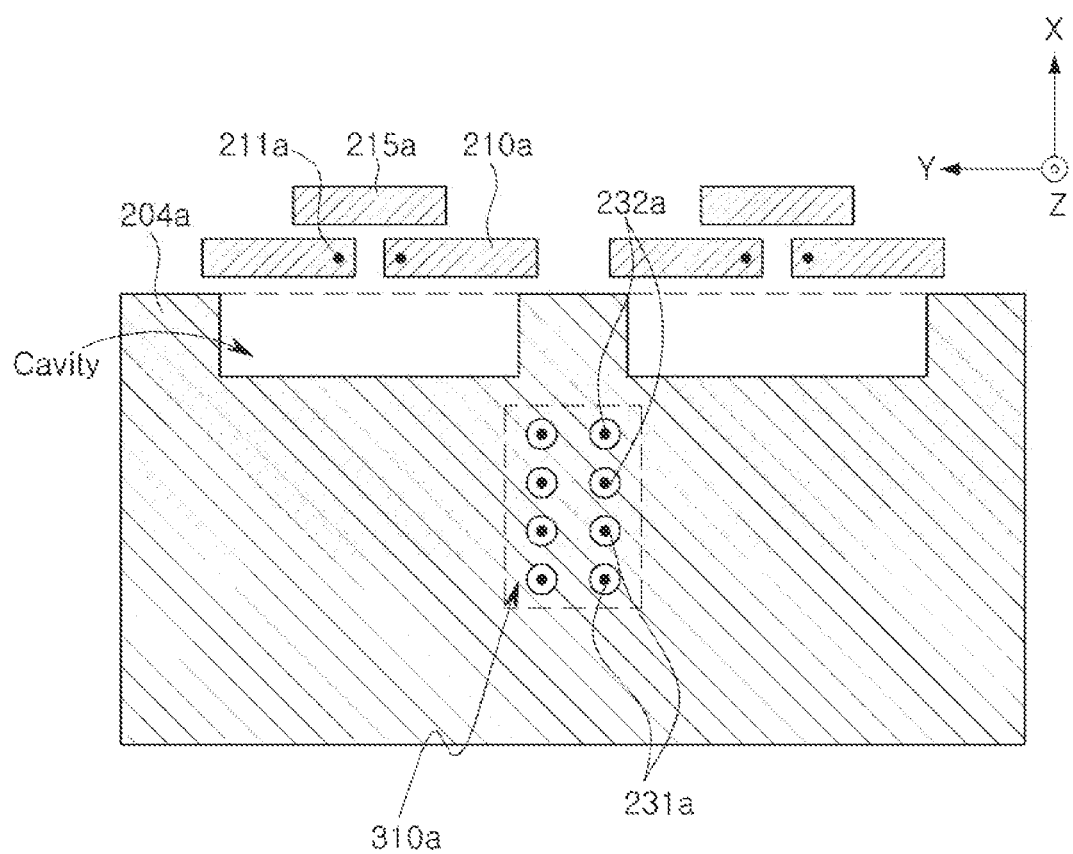

Referring to FIG. 4E, a fourth ground layer 204a may have a plurality of through-holes through which the first wiring via 231a and the second wiring via 232a pass. An IC 310a may be disposed below the fourth ground layer 204a, and may be electrically connected to the first wiring via 231a and the second wiring via 232a. The end-fire patch antenna pattern 210a and a director pattern 215a may be disposed at substantially the same height as the fourth ground layer 204a.

The fourth ground layer 204a may provide a circuit in the IC 310a and/or a ground used in the passive component as the IC 310a and/or as the passive component. Depending on the design, the fourth ground layer 204a may provide a transmission path of power and signals used in the IC 310a and/or the passive component. Therefore, the fourth ground layer 204a may be electrically connected to the IC and/or the passive component.

The second ground layer 202a, the third ground layer 203a, and the fourth ground layer 204a may have a depressed shape to provide a cavity. Accordingly, the end-fire patch antenna pattern 210a may be disposed closer to the fourth ground layer 204a. The cavity may be disposed at a position different from the cavities described above in FIGS. 1 through 4C.

A top and bottom relationship and shape of the second ground layer 202a, the third ground layer 203a, and the fourth ground layer 204a may vary depending on the design. The fifth ground layer illustrated in FIG. 1 may have a structure/function similar to the fourth ground layer 204a.

Figure 5A:
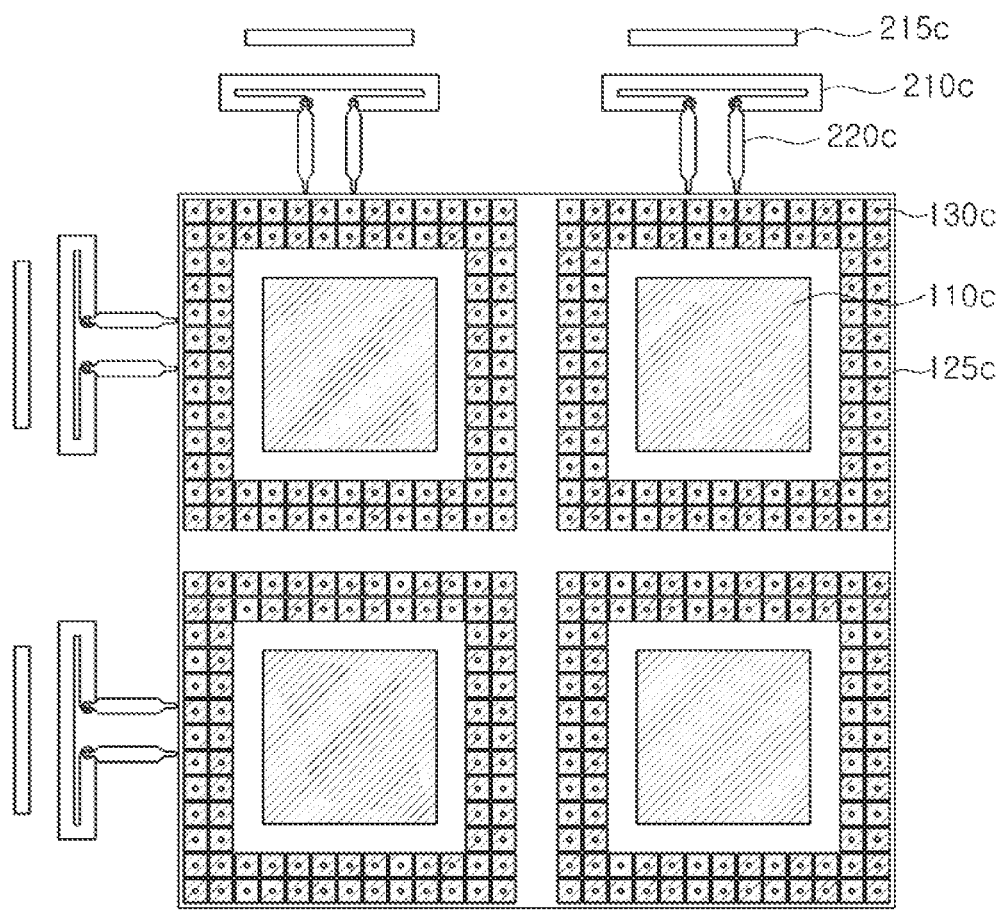
FIGS. 5A, 5B, and 5C are plan views illustrating an antenna module according to an example.
Figure 5B:
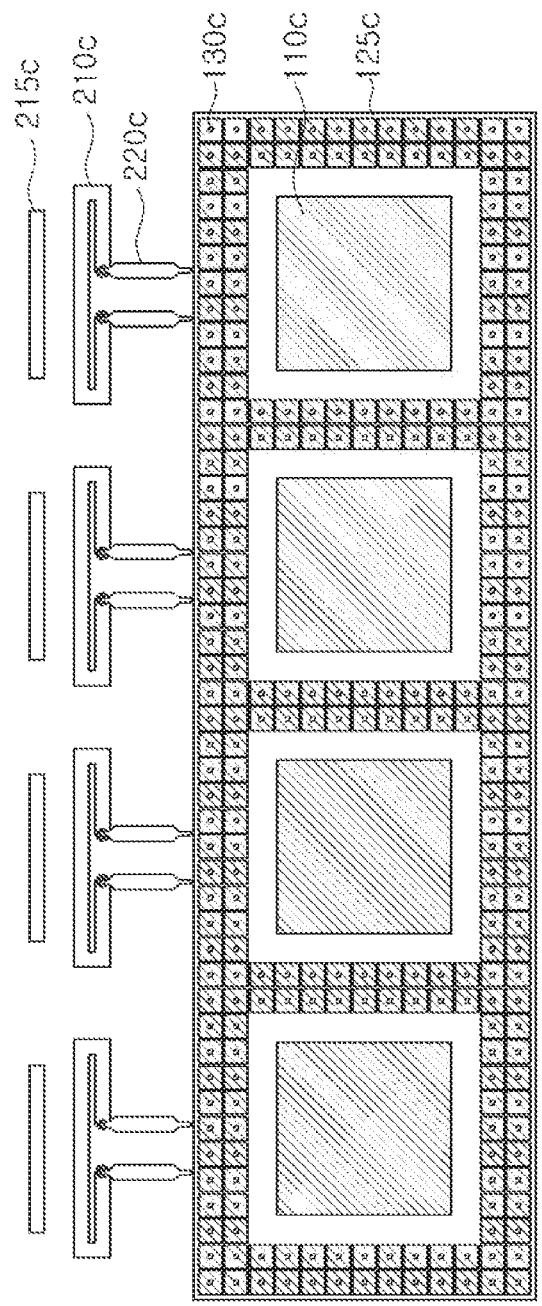
Figure 5C:
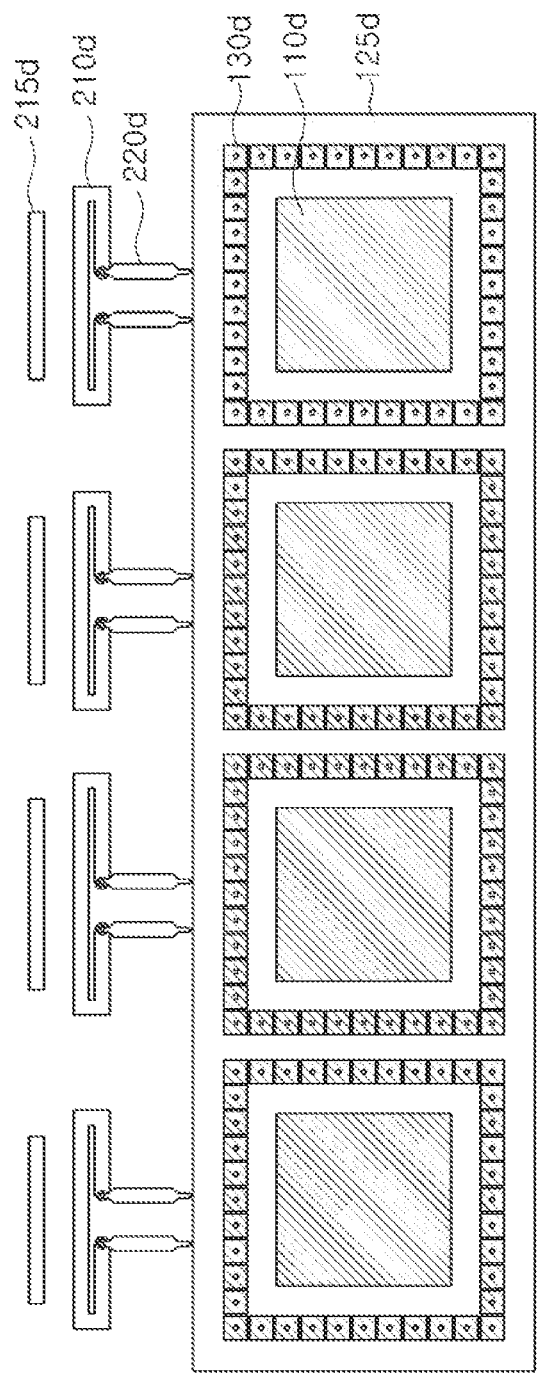

FIGS. 5A, 5B, and 5C are plan views illustrating an antenna module according to an example.

Referring to FIGS. 5A and 5B, an antenna module may include at least portions of a plurality of patch antenna patterns 110c, a ground layer 125c, a plurality of conductive layout patterns 130c, a plurality of end-fire antenna patterns 210c, a plurality of director patterns 215c, and a plurality of end-fire feed lines 220c.

The plurality of end-fire antenna patterns 210c may form a radial pattern in a second direction to transmit or receive the RF signal in the second direction (e.g., the lateral direction). For example, the plurality of end-fire antenna patterns 210c may be disposed in the connection member to be adjacent to a side surface of the connection member, and may have a dipole shape or a folded dipole shape. Here, one end of a pole of each of the plurality of end-fire antenna patterns 210c may be electrically connected to first and second lines of the plurality of end-fire antenna feed lines 220c. A frequency band of the plurality of end-fire antenna patterns 210c may be designed to be the substantially same as that of the plurality of patch antenna patterns 110c, but is not limited to such a frequency band.

The plurality of director patterns 215c may be electromagnetically coupled to the plurality of end-fire antenna patterns 210c to improve a gain or a bandwidth of the plurality of end-fire antenna patterns 210c.

The plurality of end-fire antenna feed lines 220c may transmit the RF signal received from the plurality of end-fire antenna patterns 210c to the IC, and may transmit the RF signal received from the IC to the plurality of end-fire antenna patterns 210c. The plurality of end-fire antenna feed lines 220c may be implemented as wirings of the connection member.

Therefore, since the antenna module may form the radial patterns in the first and second directions, a transmission and reception direction of the RF signal may be expanded omni-directionally.

A plurality of antenna apparatuses may be arranged in a structure of n×m as illustrated in FIG. 5A, and the antenna module including the plurality of antenna apparatuses may be disposed to be adjacent to a vertex of an electronic device.

The plurality of antenna apparatuses may be arranged in a structure of n×1 as illustrated in FIG. 5B, and the antenna module including the plurality of antenna apparatuses may be disposed to be adjacent to an intermediate point of an edge of the electronic device.

Referring to FIG. 5C, an antenna module may include at least portions of a plurality of patch antenna patterns 110d, a ground layer 125d, a plurality of conductive layout patterns 130d, a plurality of end-fire antenna patterns 210d, a plurality of director patterns 215d, and a plurality of end-fire antenna feed lines 220d.

That is, the plurality of conductive layout patterns 130d may be arranged in a structure of n×1, may be disposed to surround each of the plurality of patch antenna patterns 110d, and may be disposed to be spaced apart from each other. Accordingly, an influence of the plurality of antenna apparatuses on each other may be reduced.

Figure 6A:
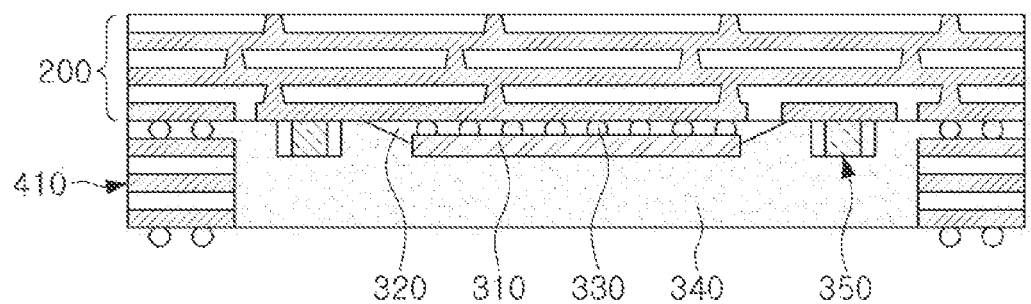
FIGS. 6A and 6B are side views illustrating a lower structure of a connection member included in an antenna module according to an example.
Figure 6B:
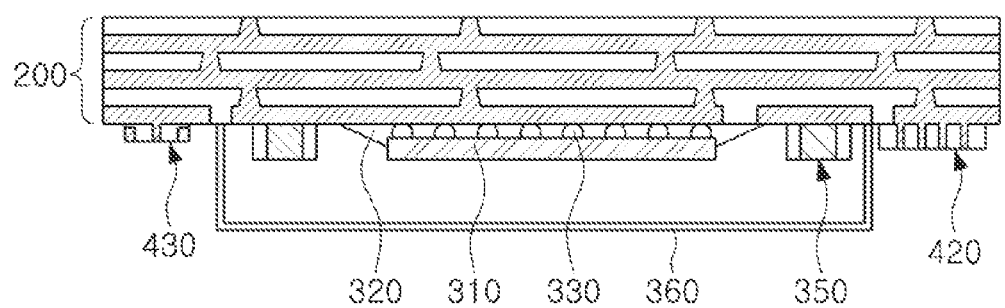

FIGS. 6A and 6B are side views illustrating a lower structure of a connection member included in the antenna module according to an example.

Referring to FIG. 6A, the antenna module may include at least portions of a connection member 200, an IC 310, adhesive members 320, electrical connection structures 330, an encapsulant 340, passive components 350, and sub-substrates 410.

The connection member 200 may have a structure similar to the connection member described above with reference to FIGS. 1 through 5C.

The IC 310 may be the same as the IC described above and may be disposed below the connection member 200. The IC 310 may be electrically connected to a wiring of the connection member 200 to transmit or receive the RF signal, and may be electrically connected to a ground layer of the connection member 200 to be provided with a ground. For example, the IC 310 may perform at least a portion of frequency conversion, amplification, filtering, phase control, and power generation to generate a converted signal.

The adhesive member 320 may bond the IC 310 and the connection member 200 to each other.

The electrical connection structures 330 may electrically connect the IC 310 and the connection member 200 to each other. For example, the electrical connection structures 330 may have a structure such as solder balls, pins, lands, and pads. The electrical connection structures 330 may have a melting point lower than a melting point of the wiring of the connection member 200 and the ground layer to electrically connect the IC 310 and the connection member 200 to each other through a predetermined process using the low melting point.

The encapsulant 340 may encapsulate at least a portion of the IC and may improve a heat radiation performance and a shock protection performance of the IC 310. For example, the encapsulant 340 may be formed of a photo imageable encapsulant (PIE), Ajinomoto build-up film (ABF), epoxy molding compound (EMC), or the like.

The passive component 350 may be disposed on a lower surface of the connection member 200, and may be electrically connected to the wiring of the connection member 200 and/or the ground layer through the electrical connection structures 330. For example, the passive component 350 may include at least a portion of a capacitor (e.g., a multilayer ceramic capacitor (MLCC)), an inductor, and a chip resistor.

The sub-substrate 410 may be disposed below the connection member 200, and may be electrically connected to the connection member 200 to receive an intermediate frequency (IF) signal or a base band signal from the outside and to transmit the IF signal or the base band signal to the IC 310, or to receive the IF signal or the base band signal from the IC 310 and transmit the IF signal or the base band signal to the outside. Here, frequencies (e.g., 24 GHz, 28 GHz, 36 GHz, 39 GHz, and 60 GHz) of the RF signal may be greater than frequencies (e.g., 2 GHz, 5 GHz, 10 GHz, and the like) of the IF signal.

For example, the sub-substrate 410 may transmit or receive the IF signal or the base band signal to the IC 310 or from the IC 310 through the wiring included in an IC ground layer of the connection member 200. Since a first ground layer of the connection member 200 is disposed between the IC ground layer and the wiring, the IF signal or the base band signal and the RF signal may be electrically isolated within the antenna module.

Referring to FIG. 6B, the antenna module may include at least portions of a shielding member 360, a connector 420, and a chip antenna 430.

The shielding member 360 may be disposed below the connection member 200 and may be disposed to confine the IC 310 together with the connection member 200. For example, the shielding member 360 may be disposed to cover (e.g., conformal shield) the IC 310 and the passive component 350 together or cover (e.g., compartment shield) the IC 310 and the passive component 350, respectively. For example, the shielding member 360 may have a hexahedron shape with one surface opened, and may have a receiving space of the hexahedron through coupling with the connection member 200. The shielding member 360 may be formed of a material having high conductivity such as copper to have a short skin depth, and may be electrically connected to the ground layer of the connection member 200. Therefore, the shielding member 360 may reduce electromagnetic noise that the IC 310 and the passive component 350 may receive.

The connector 420 may have a connection structure of a cable (e.g., a coaxial cable, a flexible PCB), may be electrically connected to the IC ground layer of the connection member 200, and may perform a function similar to the sub-substrate described above. The connector 420 may be provided with an IF signal, a base band signal and/or power from the cable, or may provide the IF signal and/or the base band signal to the cable.

The chip antenna 430 may assist the antenna module to transmit or receive the RF signal. For example, the chip antenna 430 may include a dielectric block having a dielectric constant greater than a dielectric constant of the insulating layer, and a plurality of electrodes disposed on opposite surfaces of the dielectric block. One of the plurality of electrodes may be electrically connected to the wiring of the connection member 200, and another electrode may be electrically connected to the ground layer of the connection member 200.

Figure 7:
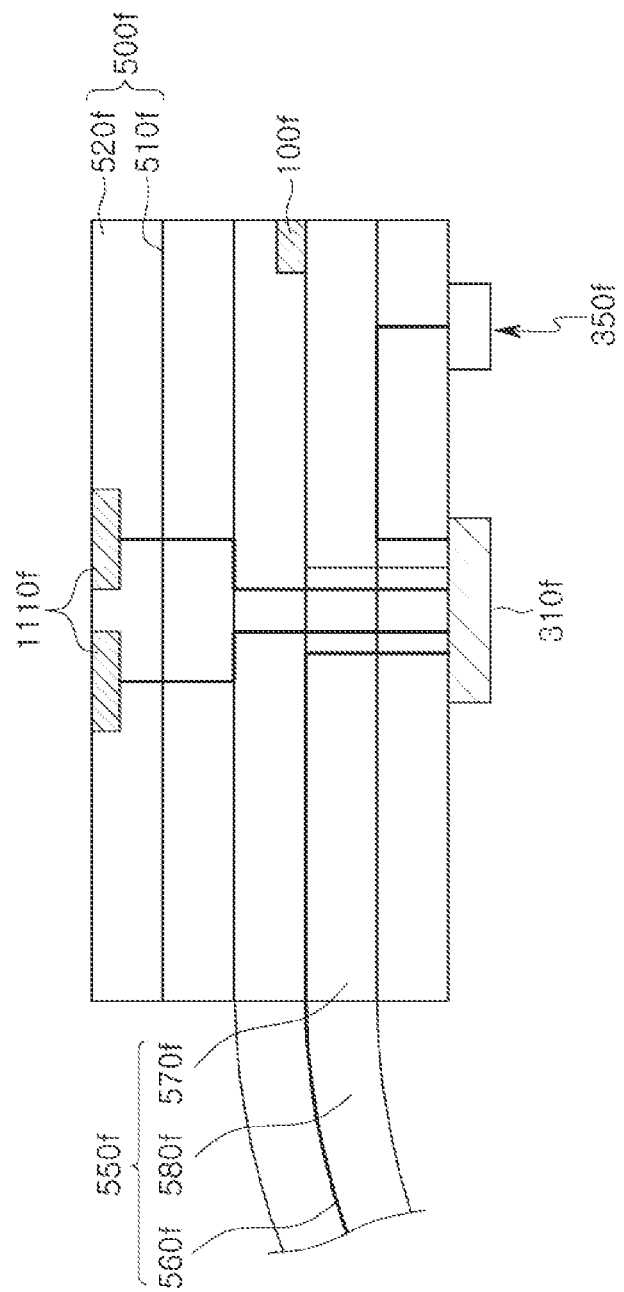
FIG. 7 is a side view illustrating a structure of an antenna module according to an example.

FIG. 7 is a side view illustrating a structure of an antenna module according to an example.

Referring to FIG. 7, the antenna module may have a structure in which an end-fire antenna 100f, a patch antenna pattern 1110f, an IC 310f, and a passive component 350f are integrated into a connection member 500f.

The end-fire antenna 100f and the patch antenna pattern 1110f may be designed in the same manner as the end-fire antenna described above and the patch antenna pattern described above, respectively, and may receive the RF signal from the IC 310f to transmit the RF signal or transmit the received RF signal to the IC 310f.

The connection member 500f may have a structure (e.g., a structure of a printed circuit board) in which at least one conductive layer 510f and at least one insulating layer 520f are stacked. The conductive layer 510f may have the ground layer and the feed line described above.

The antenna module may further include a flexible connection member 550f. The flexible connection member 550f may include a first flexible region 570f overlapping the connection member 500f and a second flexible region 580f not overlapping the connection member 500f when viewed in a vertical direction.

The second flexible region 580f may be flexibly bent in the vertical direction. Accordingly, the second flexible region 580f may be flexibly connected to a connector of a set substrate and/or an adjacent antenna module.

The flexible connection member 550f may include a signal line 560f. The IF signal and/or the base band signal may be transmitted to the IC 310f or transmitted to the connector of the set substrate and/or the adjacent antenna module through the signal line 560f.

Figure 8A:
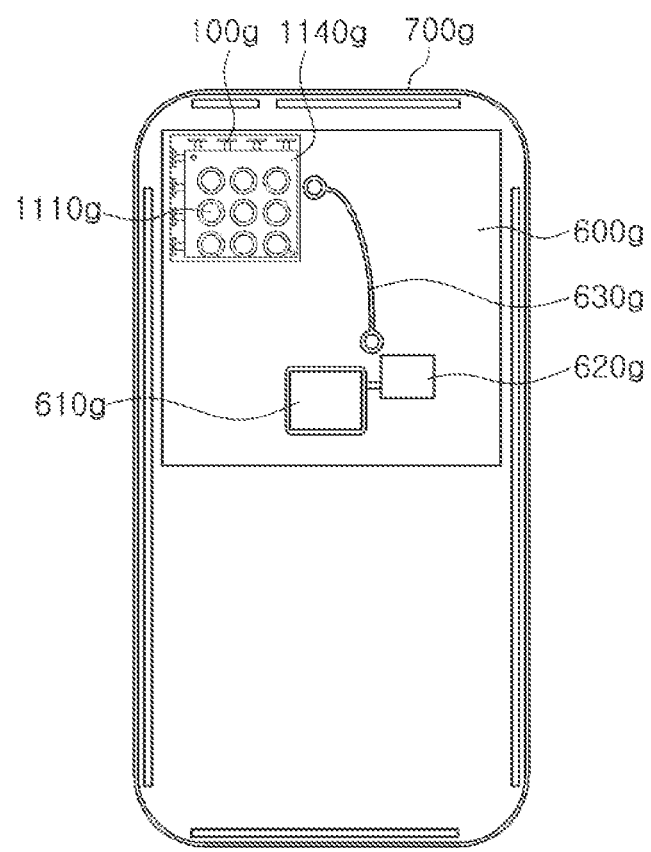
FIGS. 8A and 8B are plan views illustrating a layout of an antenna module in an electronic device according to an example.
Figure 8B:
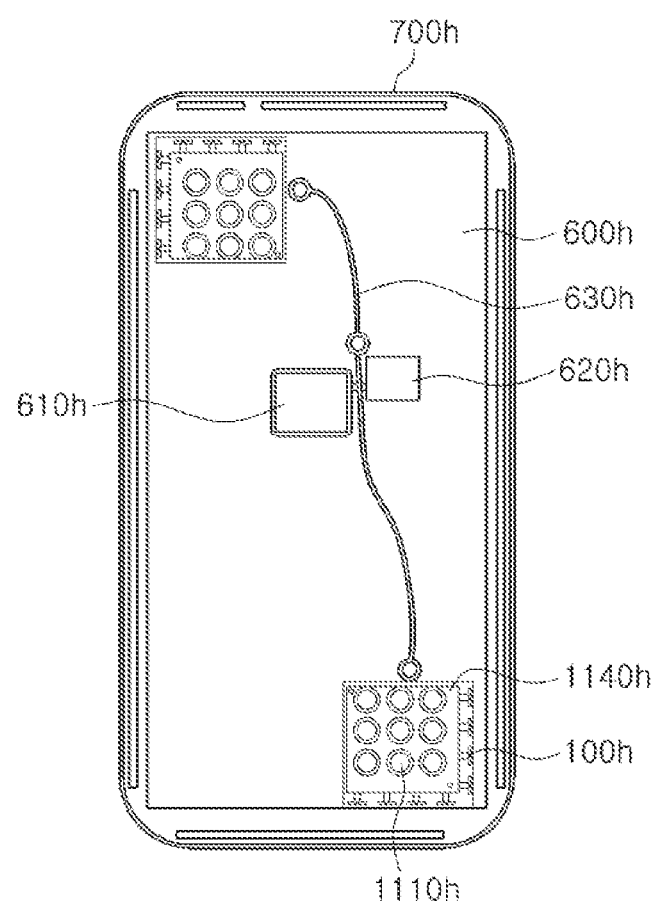

FIGS. 8A and 8B are plan views illustrating a layout of an antenna module in an electronic device according to an example.

Referring to FIG. 8A, an antenna module including an end-fire antenna 100g, a patch antenna pattern 1110g, and an insulating layer 1140g may be disposed to be adjacent to a side boundary of an electronic device 700g on a set substrate 600g of the electronic device 700g.

The electronic device 700g may be a smartphone, a personal digital assistant, a digital video camera, a digital still camera, a network system, a computer, a monitor, a tablet, a laptop, a netbook, a television, a video game, a smart watch, an automotive component, or the like, but is not limited to such devices.

A communications module 610g and a baseband circuit 620g may be further disposed on the set substrate 600g. The antenna module may be electrically connected to the communications module 610g and/or the baseband circuit 620g through a coaxial cable 630g. Depending on the design, the coaxial cable 630g may be replaced with the flexible connection member illustrated in FIG. 7.

The communications module 610g may include at least a portion of a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-digital converter, an application-specific IC (ASIC), or the like to perform a digital signal processing.

The baseband circuit 620g may generate a base signal by performing analog-digital conversion, and amplification, filtering, and frequency conversion of an analog signal. The base signal input and output from the baseband circuit 620g may be transmitted to the antenna module through a cable.

For example, the base signal may be transmitted to the IC through an electrical connection structure, a core via, and a wiring. The IC may convert the base signal into an RF signal of a millimeter wave (mmWave) band.

Referring to FIG. 8B, a plurality of antenna modules each including an end-fire antenna 100h, a patch antenna pattern 1110h, and an insulating layer 1140h may be disposed to be adjacent to a boundary of one side surface of an electronic device 700h and a boundary of the other side surface thereof, respectively, on a set substrate 600h of the electronic device 700h. A communications module 610h and a baseband circuit 620h may be further disposed on the set substrate 600h. The plurality of antenna modules may be electrically connected to the communications module 610h and/or the baseband circuit 620h through a coaxial cable 630h.

The patch antenna pattern, the patch antenna pattern, the coupling patch pattern, the feed via, the ground layer, the end-fire antenna pattern, the director pattern, and the electrical connection structure disclosed in the present specification may include a metal material (e.g., a conductive material such as copper (Cu), aluminum (Al), silver (Ag), tin (Sn), gold (Au), nickel (Ni), lead (Pb), titanium (Ti), or an alloy thereof), and may be formed by a plating method such as chemical vapor deposition (CVD), physical vapor deposition (PVD), sputtering, subtractive, additive, semi-additive process (SAP), modified semi-additive process (MSAP), or the like, but are not limited to such materials and methods.

The dielectric layer disclosed in the present specification may be formed of FR4, liquid crystal polymer (LCP), low temperature co-fired ceramic (LTCC), a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), a photo imagable dielectric (PID) resin, generic copper clad laminate (CCL), or a glass or ceramic based insulating material. The dielectric layer may be filled in at least a portion of positions at which the patch antenna pattern, the coupling patch pattern, the feed via, the ground layer, the end-fire antenna pattern, the director pattern, and the electrical connection structure are not disposed in the antenna module disclosed herein.

The RF signal disclosed herein may have a format according to wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, but is not limited to such protocols.

As set forth above, according to the examples, since the antenna module provides an environment in which each component easily has a structure advantageous for its role (RF signal transmission/reception, electrical connection, and the like), the antenna module may provide a structure advantageous for miniaturization while having the improved antenna performance.

In addition, since the antenna module according to the examples may be more efficiently manufactured for each of the components, the overall manufacturing cost of the antenna module may be reduced and the manufacturing yield may be increased.

In addition, since the antenna module according to the examples may easily have the low dielectric region, the antenna module may easily broaden diversity of the dielectric constant and may provide an efficient utilization environment of the low dielectric region.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module comprising:
 a dielectric layer;
 a coupling patch pattern;
 electrical connection structures disposed on a lower side of the dielectric layer; and
 a patch antenna pattern disposed in the dielectric layer, and disposed to be spaced apart from the electrical connection structures,
 wherein the lower side of the dielectric layer has a cavity disposed to overlap at least a portion of the patch antenna pattern in a vertical direction, and
 wherein the coupling patch pattern is disposed external to the cavity.

2. The antenna module of claim 1, wherein the cavity is disposed above a low dielectric region having a lower dielectric constant than the dielectric layer, and
 the low dielectric region is surrounded by the electrical connection structures.

3. The antenna module of claim 2, wherein a height of the cavity is longer than a height of the low dielectric region.

4. The antenna module of claim 1, further comprising a feed via providing a feed path to the patch antenna pattern,
 wherein at least a portion of the feed via is disposed in the dielectric layer.

5. The antenna module of claim 4, wherein the feed via is disposed to do not penetrate through the cavity.

6. The antenna module of claim 1, wherein the coupling patch pattern is disposed to be spaced apart from the patch antenna pattern in or on the dielectric layer.

7. The antenna module of claim 6, wherein a height of the cavity is longer than a distance between the patch antenna pattern and the coupling patch pattern.

8. The antenna module of claim 6, wherein an upper side of the cavity is larger than an upper side of the coupling patch pattern.

9. The antenna module of claim 1, wherein the electrical connection structures have a melting point that is lower than a melting point of the patch antenna pattern.

10. The antenna module of claim 1, wherein the patch antenna pattern is configured as patch antenna patterns disposed to be spaced apart from each other, and
   the cavity is configured as cavities disposed to be spaced apart from each other.

11. The antenna module of claim 10, further comprising feed vias providing feed paths to the patch antenna patterns,
   wherein at least a portion of each of the feed vias is disposed between the cavity.

12. The antenna module of claim 1, wherein a dielectric constant of the cavity is lower than a dielectric constant of the dielectric layer.

13. The antenna module of claim 1, wherein the electrical connection structures are disposed without overlapping the cavity in the vertical direction, and
   wherein the electrical connection structures are connected to the patch antenna pattern.

* * * * *